United States Patent
Wu et al.

(10) Patent No.: US 11,418,027 B1
(45) Date of Patent: Aug. 16, 2022

(54) ELECTROSTATIC DISCHARGE PROTECTION CIRCUIT

(71) Applicant: Winbond Electronics Corp., Taichung (TW)

(72) Inventors: Nai Sheng Wu, Taichung (TW); Chao-Lung Wang, Taichung (TW)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 17/225,096

(22) Filed: Apr. 7, 2021

(51) Int. Cl.
*H02H 9/04* (2006.01)
*H01L 27/02* (2006.01)

(52) U.S. Cl.
CPC ......... *H02H 9/046* (2013.01); *H01L 27/0262* (2013.01); *H01L 27/0266* (2013.01); *H01L 27/0292* (2013.01)

(58) Field of Classification Search
CPC . H02H 9/046; H01L 27/0262; H01L 27/0266; H01L 27/0292
USPC ........................................................... 361/56
See application file for complete search history.

(56) References Cited

U.S. PATENT DOCUMENTS

| | | | |
|---|---|---|---|
| 5,631,793 A | 5/1997 | Ker et al. | |
| 5,978,192 A * | 11/1999 | Young | H02H 9/046 361/111 |
| 5,982,601 A * | 11/1999 | Lin | H01L 29/87 361/111 |
| 6,618,233 B1 * | 9/2003 | Russ | H03K 17/0403 361/111 |
| 6,803,633 B2 | 10/2004 | Mergens et al. | |
| 7,123,054 B2 * | 10/2006 | Satou | H01L 27/0262 326/82 |
| 7,274,047 B2 | 9/2007 | Russ et al. | |
| 7,589,944 B2 | 9/2009 | Mergens et al. | |
| 7,800,128 B2 | 9/2010 | Domanski et al. | |
| 8,072,721 B2 | 12/2011 | Kwong et al. | |
| 8,178,897 B2 | 5/2012 | Domanski et al. | |
| 8,373,956 B2 | 2/2013 | Abou-Khalil et al. | |
| 8,441,765 B2 * | 5/2013 | Barbier | H03K 17/08122 361/56 |
| 2006/0268477 A1 * | 11/2006 | Camp | H01L 27/0262 361/56 |
| 2019/0214380 A1 | 7/2019 | Lin et al. | |

FOREIGN PATENT DOCUMENTS

TW 200504990 2/2005
TW I646746 1/2019

OTHER PUBLICATIONS

"Office Action of Taiwan Counterpart Application", dated Nov. 24, 2021, p. 1-p. 8.

* cited by examiner

*Primary Examiner* — Dharti H Patel
(74) *Attorney, Agent, or Firm* — JCIPRNET

(57) ABSTRACT

An electrostatic discharge protection circuit including a silicon controlled rectifier and a transistor is provided. The silicon controlled rectifier includes a first end, a second end, and a third end. The first end of the silicon controlled rectifier is coupled to a first pad. The second end of the silicon controlled rectifier is coupled to a second pad. The transistor includes a first end, a second end, and a control end. The first end of the transistor is coupled to the first pad. The second end of the transistor is coupled to the second pad. The control end of the transistor is coupled to the third end of the silicon controlled rectifier.

17 Claims, 1 Drawing Sheet

ELECTROSTATIC DISCHARGE PROTECTION CIRCUIT

BACKGROUND

Technical Field

The disclosure relates to an electronic circuit, and in particular to an electrostatic discharge protection circuit.

Description of Related Art

To protect an integrated circuit from being damaged by an electrostatic discharge, an electrostatic discharge protection circuit constructed on a chip is a necessary element in the chip. In the conventional technology, an electrostatic discharge protection circuit including a silicon controlled rectifier usually requires a trigger element to trigger an operation of the silicon controlled rectifier to provide a path for electrostatic charges to be released when an electrostatic discharge event occurs, so as to protect the integrated circuit. In the related art, various layout methods can realize the circuit structure of the electrostatic discharge protection circuit with the trigger element and the silicon controlled rectifier. However, in these circuit structures, a transistor which serves as the trigger element usually cannot serve as a path for electrostatic charges to be released so as to improve electrostatic discharge protection.

SUMMARY

The disclosure provides an electrostatic discharge protection circuit, which provides good electrostatic discharge protection.

The electrostatic discharge protection circuit of the disclosure includes a silicon controlled rectifier and a first transistor. The silicon controlled rectifier includes a first end, a second end, and a third end. The first end of the silicon controlled rectifier is coupled to a first pad. The second end of the silicon controlled rectifier is coupled to a second pad. The first transistor includes a first end, a second end, and a control end. The first end of the first transistor is coupled to the first pad. The second end of the first transistor is coupled to the second pad. The control end of the first transistor is coupled to the third end of the silicon controlled rectifier.

To further describe the features and advantages of the disclosure, embodiments accompanied with drawings are described below in details.

DESCRIPTION OF THE EMBODIMENTS

Figure 1:
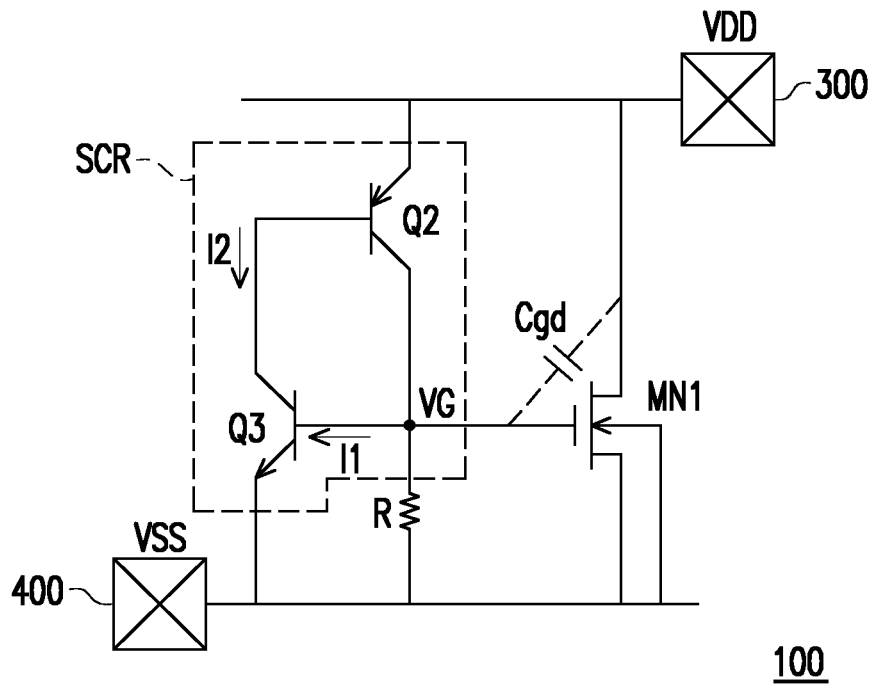
FIG. 1 illustrates a schematic circuit diagram of an electrostatic discharge protection circuit according to an embodiment of the disclosure.

FIG. 1 illustrates a schematic circuit diagram of an electrostatic discharge protection circuit according to an embodiment of the disclosure. An electrostatic discharge protection circuit 100 of this embodiment includes a silicon controlled rectifier SCR, a first transistor MN1, and a resistor element R.

The first transistor MN1 includes a first end, a second end, and a control end. The first end of the first transistor MN1 is coupled to a first pad 300. The second end of the first transistor MN1 is coupled to a second pad 400. The control end of the first transistor MN1 is coupled to the silicon controlled rectifier SCR. The voltage of the control end of the first transistor MN1 is marked as VG in FIG. 1. The first pad 300 may be coupled to a first system voltage VDD. The second pad 400 may be coupled to a second system voltage VSS. The first system voltage VDD is greater than the second system voltage VSS. In an embodiment, the second system voltage VSS is, for example, a grounding voltage.

In this embodiment, the first transistor MN1 is an N-type metal-oxide-semiconductor field-effect transistor (MOSFET), and the first end, the second end, and the control end thereof are respectively the drain, source, and gate of the transistor. A parasitic capacitance Cgd exists between the first end and the control end.

The silicon controlled rectifier SCR includes a first end, a second end, and a third end. The first end of the silicon controlled rectifier SCR is coupled to the first pad 300. The second end of the silicon controlled rectifier SCR is coupled to the second pad 400. The third end of the silicon controlled rectifier SCR is coupled to the control end of the first transistor MN1. The silicon controlled rectifier SCR includes a second transistor Q2 and a third transistor Q3. The second transistor Q2 includes a first end, a second end, and a control end. The first end of the second transistor Q2 is coupled to the first pad 300. The second end of the second transistor Q2 is coupled to the control end of the first transistor MN1. The control end of the second transistor Q2 is coupled to the third transistor Q3. The third transistor Q3 includes a first end, a second end, and a control end. The first end of the third transistor Q3 is coupled to the control end of the second transistor Q2. The second end of the third transistor Q3 is coupled to the second pad 400. The control end of the third transistor Q3 is coupled to the control end of the first transistor MN1.

In this embodiment, the first end of the second transistor Q2 serves as the first end of the silicon controlled rectifier SCR. The second end of the third transistor Q3 serves as the second end of the silicon controlled rectifier SCR. The control end of the third transistor Q3 serves as the third end of the silicon controlled rectifier SCR. In this embodiment, the second transistor Q2 is a PNP-type bipolar junction transistor (BJT), and the first end, the second end, and the control end thereof are respectively the emitter, collector, and base of the transistor. The third transistor Q3 is an NPN-type bipolar junction transistor, and the first end, the second end, and the control end thereof are respectively the collector, emitter, and base of the transistor.

The resistor element R includes a first end and a second end. The first end of resistor element R is coupled to the control end of the first transistor MN1. The second end of resistor element R is coupled to the second pad 400.

In this embodiment, the electrostatic discharge protection circuit 100 may be operated in a normal operation mode and an electrostatic discharge protection mode. In the normal operation mode, the first pad 300 is coupled to the first system voltage VDD, and the second pad 400 is coupled to the second system voltage VSS, for example, a grounding voltage. The collector and base of the third transistor Q3 are in a reverse biased state, so the second transistor Q2 is not turned on. Since the second transistor Q2 is not turned on and the voltage VG of the control end of the first transistor MN1 is grounded, the third transistor Q3 and first transistor MN1 are not turned on, and no current flows through the silicon controlled rectifier SCR and first transistor MN1.

When an electrostatic discharge event occurs, the electrostatic discharge protection circuit 100 may be operated in the electrostatic discharge protection mode. The electrostatic discharge event including an ESD pulse appears on the first pad 300, so a large number of electrostatic charges are accumulated on the first pad 300. In the electrostatic discharge protection mode, when an electrostatic discharge event occurs, according to a response of the resistor element R and the parasitic capacitance Cgd, the voltage VG of the control end of the first transistor MN1 rises so as to trigger the operation of the silicon controlled rectifier SCR. That is, according to the response of the resistor element R and the parasitic capacitance Cgd, two ends of the resistor element R generate a potential difference. When the second system voltage VSS is a grounding voltage, the potential difference between the two ends of the resistor element R is the voltage VG of the control end of the first transistor MN1, and the voltage VG is adapted for triggering the operation of the silicon controlled rectifier SCR.

Specifically, when the voltage VG of the control end of the first transistor MN1 rises, a first current I1 is generated at the control end of the third transistor Q3. The first current I1 flows into the control end of the third transistor Q3 to turn on the third transistor Q3. When the third transistor Q3 is turned on, a second current I2 is generated at the control end of the second transistor Q2. The second current I2 flows out of the control end of the second transistor Q2 to turn on the second transistor Q2. When the second transistor Q2 and the third transistor Q3 are turned on, the silicon controlled rectifier SCR is turned on, and electrostatic charges are transferred from the first pad 300 through the silicon controlled rectifier SCR to the second pad 400.

On the other hand, when the electrostatic charges are transferred from the first pad 300 through silicon controlled rectifier SCR to the second pad 400, the voltage VG of the control end of the first transistor MN1 continues to rise so as to turn on the first transistor MN1. When the first transistor MN1 is turned on, the electrostatic charges may be transferred from the first pad 300 through the first transistor MN1 to the second pad 400, too. Therefore, in this embodiment, when an electrostatic discharge event occurs, the electrostatic discharge protection circuit 100 at least provides two transfer paths for electrostatic charges, and thus the electrostatic discharge protection circuit 100 may provide good electrostatic discharge protection.

Figure 2:
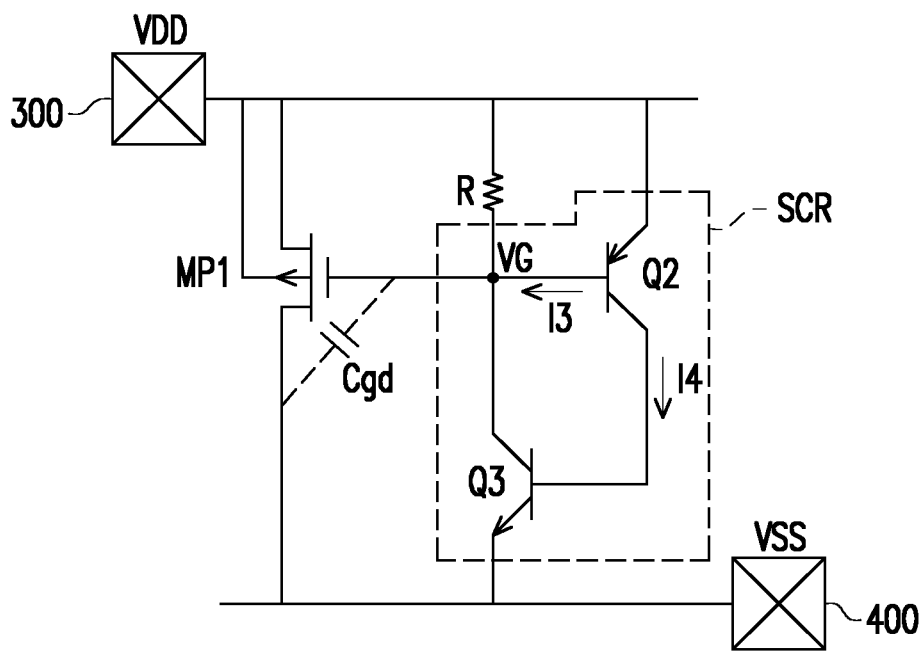
FIG. 2 illustrates a schematic circuit diagram of an electrostatic discharge protection circuit according to another embodiment of the disclosure.

FIG. 2 illustrates a schematic circuit diagram of an electrostatic discharge protection circuit according to another embodiment of the disclosure. An electrostatic discharge protection circuit 200 of this embodiment includes the silicon controlled rectifier SCR, a first transistor MP1, and the resistor element R.

The first transistor MP1 includes a first end, a second end, and a control end. The first end of the first transistor MP1 is coupled to the first pad 300. The second end of the first transistor MP1 is coupled to the second pad 400. The control end of the first transistor MP1 is coupled to the silicon controlled rectifier SCR. In this embodiment, the first transistor MP1 is a P-type metal-oxide-semiconductor field-effect transistor, and the first end, the second end, and the control end thereof are respectively the source, drain, and gate of the transistor. The parasitic capacitance Cgd exists between the second end and the control end.

The silicon controlled rectifier SCR includes the first end, the second end, and the third end. The first end of the silicon controlled rectifier SCR is coupled to the first pad 300. The second end of the silicon controlled rectifier SCR is coupled to the second pad 400. The third end of the silicon controlled rectifier SCR is coupled to the control end of the first transistor MP1. The silicon controlled rectifier SCR includes the second transistor Q2 and the third transistor Q3. The second transistor Q2 includes the first end, the second end, and the control end. The first end of the second transistor Q2 is coupled to the first pad 300. The second end of the second transistor Q2 is coupled to the control end of the third transistor Q3. The control end of the second transistor Q2 is coupled to the control end of the first transistor MP1. The third transistor Q3 includes the first end, the second end, and the control end. The first end of the third transistor Q3 is coupled to the control end of the second transistor Q2. The second end of the third transistor Q3 is coupled to the second pad 400. The control end of the third transistor Q3 is coupled to the second end of the second transistor Q2.

In this embodiment, the first end of the second transistor Q2 serves as the first end of the silicon controlled rectifier SCR. The second end of the third transistor Q3 serves as the second end of the silicon controlled rectifier SCR. The control end of the second transistor Q2 serves as the third end of the silicon controlled rectifier SCR. In this embodiment, the second transistor Q2 is a PNP-type bipolar junction transistor, and the first end, the second end, and the control end thereof are respectively the emitter, collector, and base of the transistor. The third transistor Q3 is an NPN-type bipolar junction transistor, and the first end, the second end, and the control end thereof are respectively the collector, emitter, and base of the transistor.

The resistor element R includes the first end and the second end. The first end of the resistor element R is coupled to the first pad 300. The second end of the resistor element R is coupled to the control end of the first transistor MP1.

In the electrostatic discharge protection mode, when an electrostatic discharge event occurs, according to a response of the resistor element R and the parasitic capacitance Cgd, the voltage VG of the control end of the first transistor MP1 drops so as to trigger the operation of the silicon controlled rectifier SCR. That is, according to the response of the resistor element R and the parasitic capacitance Cgd, the two ends of the resistor element R generate a potential difference. The potential difference between the two ends of the resistor element R is the difference between the first system voltage VDD and the voltage VG of the control end of the first transistor MP1, and the voltage VG is adapted for triggering the operation of the silicon controlled rectifier SCR.

Specifically, when the voltage VG of the control end of the first transistor MP1 drops, a third current I3 is generated at the control end of the second transistor Q2. The third current I3 flows out of the control end of the second transistor Q2 to turn on the second transistor Q2. When the second transistor Q2 is turned on, a fourth current I4 is generated at the control end of the third transistor Q3. The fourth current I4 flows into the control end of the third transistor Q3 to turn on the third transistor Q3. When the second transistor Q2 and the third transistor Q3 are turned on, the silicon controlled rectifier SCR is turned on, and the electrostatic charges are transferred from the first pad 300 through the silicon controlled rectifier SCR to the second pad 400.

On the other hand, when the electrostatic charges are transferred from the first pad 300 through the silicon controlled rectifier SCR to the second pad 400, the voltage VG of the control end of the first transistor MP1 continues to drop so as to turn on the first transistor MP1. When the first transistor MP1 is turned on, the electrostatic charges may be transferred from the first pad 300 through the first transistor MP1 to the second pad 400, too. Therefore, in this embodiment, when an electrostatic discharge event occurs, the electrostatic discharge protection circuit 100 at least provides two transfer paths for electrostatic charges, and thus the electrostatic discharge protection circuit 100 may provide good electrostatic discharge protection.

In summary, in the embodiments of the disclosure, when an electrostatic discharge event occurs, the electrostatic discharge protection circuit may at least provide two transfer paths for electrostatic charges: one is the transfer path including the silicon controlled rectifier, and the other is the transfer path including a trigger transistor. The silicon controlled rectifier is turned on by the response of the parasitic capacitance and the resistor element. The trigger transistor is turned on by a cross pressure generated at the two ends of the resistor element by the large current generated after the silicon controlled rectifier is turned on. Therefore, the control voltage at the control end of the trigger transistor may trigger the silicon controlled rectifier and the trigger transistor itself to be turned on to provide two transfer paths for electrostatic charges, so as to improve electrostatic discharge protection.

Although the disclosure has been disclosed in the above by way of embodiments, the embodiments are not intended to limit the disclosure. Those with ordinary knowledge in the technical field can make various changes and modifications without departing from the spirit and scope of the disclosure. Therefore, the scope of protection of the disclosure is defined by the scope of the appended claims.

What is claimed is:

1. An electrostatic discharge protection circuit, comprising:
    a silicon controlled rectifier, comprising a first end, a second end, and a third end, wherein the first end of the silicon controlled rectifier is coupled to a first pad, and the second end of the silicon controlled rectifier is coupled to a second pad;
    a first transistor, comprising a first end, a second end, and a control end, wherein the first end of the first transistor is coupled to the first pad, the second end of the first transistor is coupled to the second pad, and the control end of the first transistor is coupled to the third end of the silicon controlled rectifier; and
    a resistor element, wherein a potential difference between two ends of the resistor element is adapted for triggering an operation of the silicon controlled rectifier, wherein the first transistor provides a parasitic capacitance, and when an electrostatic discharge event occurs, according to a response of the resistor element and the parasitic capacitance, the two ends of the resistor element generate the potential difference.

2. The electrostatic discharge protection circuit according to claim 1, wherein the resistor element is coupled between the second end and the third end of the silicon controlled rectifier, and the silicon controlled rectifier comprises:
    a second transistor, comprising a first end, a second end, and a control end, wherein the first end of the second transistor serves as the first end of the silicon controlled rectifier and is coupled to the first pad, and the second end of the second transistor is coupled to the control end of the first transistor; and
    a third transistor, comprising a first end, a second end, and a control end, wherein the first end of the third transistor is coupled to the control end of the second transistor, the second end of the third transistor serves as the second end of the silicon controlled rectifier and is coupled to the second pad, and the control end of the third transistor serves as the third end of the silicon controlled rectifier and is coupled to the control end of the first transistor.

3. The electrostatic discharge protection circuit according to claim 2, wherein when the electrostatic discharge event occurs, according to the response of the resistor element and the parasitic capacitance, a voltage of the control end of the first transistor rises so as to trigger the operation of the silicon controlled rectifier.

4. The electrostatic discharge protection circuit according to claim 3, wherein when the voltage of the control end of the first transistor rises, a first current is generated at the control end of the third transistor and flows into the control end of the third transistor to turn on the third transistor.

5. The electrostatic discharge protection circuit according to claim 4, wherein when the third transistor is turned on, a second current is generated at the control end of the second transistor and flows out of the control end of the second transistor to turn on the second transistor.

6. The electrostatic discharge protection circuit according to claim 5, wherein when the second transistor and the third transistor are turned on, the silicon controlled rectifier is turned on, and electrostatic charges are transferred from the first pad through the silicon controlled rectifier to the second pad.

7. The electrostatic discharge protection circuit according to claim 6, wherein when the electrostatic charges are transferred from the first pad through the silicon controlled rectifier to the second pad, the voltage of the control end of the first transistor rises so as to turn on the first transistor.

8. The electrostatic discharge protection circuit according to claim 7, wherein when the first transistor is turned on, the electrostatic charges are transferred from the first pad through the first transistor to the second pad.

9. The electrostatic discharge protection circuit according to claim 2, wherein the first transistor is an N-type metal-oxide-semiconductor field-effect transistor, the second transistor is a PNP-type bipolar junction transistor, and the third transistor is an NPN-type bipolar junction transistor.

10. The electrostatic discharge protection circuit according to claim 1, wherein the resistor element is coupled between the first end and the third end of the silicon controlled rectifier, and the silicon controlled rectifier comprises:
    a second transistor, comprising a first end, a second end, and a control end, wherein the first end of the second transistor serves as the first end of the silicon controlled rectifier and is coupled to the first pad, and the control end of the second transistor serves as the third end of the silicon controlled rectifier and is coupled to the control end of the first transistor; and
    a third transistor, comprising a first end, a second end, and a control end, where the first end of the third transistor is coupled to the control end of the second transistor, the second end of the third transistor serves as the second end of the silicon controlled rectifier and is coupled to the second pad, and the control end of the third transistor is coupled to the second end of the second transistor.

11. The electrostatic discharge protection circuit according to claim 10, wherein when the electrostatic discharge event occurs, according to the response of the resistor element and the parasitic capacitance, a voltage of the control end of the first transistor drops so as to trigger the operation of the silicon controlled rectifier.

12. The electrostatic discharge protection circuit according to claim 11, wherein when the voltage of the control end of the first transistor drops, a third current is generated at the control end of the second transistor and flows out of the control end of the second transistor to turn on the second transistor.

13. The electrostatic discharge protection circuit according to claim 12, wherein when the second transistor s turned on, a fourth current is generated at the control end of the third transistor and flows into the control end of the third transistor to turn on the third transistor.

14. The electrostatic discharge protection circuit according to claim 13, wherein when the second transistor and the third transistor are turned on, the silicon controlled rectifier is turned on, and electrostatic charges are transferred from the first pad through the silicon controlled rectifier to the second pad.

15. The electrostatic discharge protection circuit according to claim 14, wherein when the electrostatic charges are transferred from the first pad through the silicon controlled rectifier to the second pad, the voltage of the control end of the first transistor drops so as to turn on the first transistor.

16. The electrostatic discharge protection circuit according to claim 15, wherein when the first transistor is turned on, the electrostatic charges are transferred from the first pad through the first transistor to the second pad.

17. The electrostatic discharge protection circuit according to claim 10, wherein the first transistor is a P-type metal-oxide-semiconductor field-effect transistor, the second transistor is a PNP-type bipolar junction transistor, and the third transistor is an NPN-type bipolar junction transistor.

* * * * *